(12) United States Patent
Niroui et al.

(10) Patent No.: US 10,566,492 B2
(45) Date of Patent: Feb. 18, 2020

(54) ELECTRICALLY DRIVEN LIGHT-EMITTING TUNNEL JUNCTIONS

(71) Applicant: Massachusetts Institute of Technology, Cambridge, MA (US)

(72) Inventors: Farnaz Niroui, Ontario (CA); Thomas Stephen Mahony, Cambridge, MA (US); Vladimir Bulovic, Lexington, MA (US); Jeffrey H. Lang, Sudbury, MA (US)

(73) Assignee: Massachuesetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/781,652

(22) PCT Filed: Dec. 7, 2016

(86) PCT No.: PCT/US2016/065288
§ 371 (c)(1),
(2) Date: Jun. 5, 2018

(87) PCT Pub. No.: WO2017/100260
PCT Pub. Date: Jun. 15, 2017

(65) Prior Publication Data
US 2018/0323335 A1 Nov. 8, 2018

Related U.S. Application Data

(60) Provisional application No. 62/264,042, filed on Dec. 7, 2015.

(51) Int. Cl.
  *H01L 23/00* (2006.01)
  *H01L 33/00* (2010.01)
  *H01L 33/06* (2010.01)
  *H01L 33/36* (2010.01)

(52) U.S. Cl.
  CPC .......... *H01L 33/0037* (2013.01); *H01L 33/06* (2013.01); *H01L 33/36* (2013.01)

(58) Field of Classification Search
  CPC .................................................. H01L 33/0037
  USPC ............................................................ 257/3
  See application file for complete search history.

(56) References Cited

U.S. PATENT DOCUMENTS

| 3,116,427 | A | * | 12/1963 | Giaever | G11C 11/44 257/35 |
| 4,160,931 | A | * | 7/1979 | Lambe | H05B 33/145 257/E33.044 |
| 4,603,280 | A | * | 7/1986 | Pankove | H05B 33/22 313/506 |
| 6,475,321 | B1 | | 11/2002 | Ikeda et al. | |

(Continued)

FOREIGN PATENT DOCUMENTS

| WO | WO 2014/117161 | 7/2014 |
| WO | WO 2017/083390 | 5/2017 |

OTHER PUBLICATIONS

International Search Report and Written Opinion dated Jan. 23, 2017 for Application No. PCT/US2016/061140.

(Continued)

*Primary Examiner* — Jami Valentine Miller
(74) *Attorney, Agent, or Firm* — Wolf, Greenfield & Sacks, P.C.

(57) ABSTRACT

Light-emitting devices are disclosed. In some embodiments, the devices may emit light when a tunneling current is generated within the device.

20 Claims, 9 Drawing Sheets

(56) References Cited

U.S. PATENT DOCUMENTS

| | | | |
|---|---|---|---|
| 7,728,333 B2* | 6/2010 | Kastalsky | B82Y 20/00 257/72 |
| 8,334,464 B2 | 12/2012 | Edwards et al. | |
| 8,383,014 B2 | 2/2013 | Vanheusden et al. | |
| 9,302,908 B2 | 4/2016 | Paranjape et al. | |
| 9,336,919 B2 | 5/2016 | Kagan et al. | |
| 9,691,998 B2 | 6/2017 | Lay et al. | |
| 9,991,076 B2 | 6/2018 | Bulovic et al. | |
| 2006/0119853 A1 | 6/2006 | Baumberg et al. | |
| 2011/0170225 A1 | 7/2011 | Rogers et al. | |
| 2012/0154793 A1 | 6/2012 | Pryce et al. | |
| 2014/0147717 A1* | 5/2014 | Sundararajan | H01M 2/1077 429/99 |
| 2014/0211195 A1 | 7/2014 | Barcelo et al. | |
| 2014/0252316 A1 | 9/2014 | Yan et al. | |
| 2015/0228805 A1 | 8/2015 | Bulovic et al. | |
| 2015/0303256 A1 | 10/2015 | Dubertret et al. | |
| 2016/0238591 A1 | 8/2016 | Deng et al. | |
| 2018/0330897 A1 | 11/2018 | Lang et al. | |

OTHER PUBLICATIONS

International Preliminary Report on Patentability dated May 24, 2018 for Application No. PCT/US2016/061140.

Akkerman et al., Electron tunneling through alkanedithiol self-assembled monolayers in large-area molecular junctions. Proc Natl Acad Sci U S A. Jul. 3, 2007;104(27):11161-6. Epub Jun. 25, 2007.

Akselrod et al., Probing the mechanisms of large Purcell enhancement in plasmonic nanoantennas. Nat Photon. Nov. 2014;8:835-40. Epub Oct. 12, 2014.

Casimir, On the attraction between two perfectly conducting plates. Proc K Ned Akad Wet. 1948;51:793-5.

Casimir et al. The influence of retardation on the London-van der Waals forces. Phys Rev. Feb. 15, 1948;73(4):360-72.

Chen et al.,Tetrapodal molecular switches and motors: Synthesis and photochemistry. J. Org. Chem. 2014;79:7032-40. Epub Jun. 30, 2014.

Chen et al., Controlled chemical and structural properties of mixed self-assembled monolayers of alkanethiols on Au(111). Langmuir. 2000;16(24):9287-93. Epub Nov. 3, 2000.

Dadgour et al., Scaling and variability analysis of CNT-based NEMS devices and circuits with implications for process design. 2008 IEEE Intl Electron Devices Meet., San Francisco, CA. Tech Dig. Dec. 2008;1-4. doi: 10.1109/IEDM.2008.4796742.

Davis, Theory of surface-plasmon excitation in metal-insulator-metal tunnel junctions. Phys Rev. B. Sep. 15, 1977;16(6):2482-90.

Del Rio et al., Elastic and adhesive properties of alkanethiol self-assembled monolayers on gold. Appl. Phys. Lett. 2009;94:131909(1-3). Epub Apr. 1, 2009.

Dzyaloshinskii et al., the general theory of van der Waals forces. Adv Phys. 1961;10(38):165-209; also pub as Sep.-Oct. 1961 Sov Phys Usp. 73(4), 153-76, English Translation.

Erbe et al., A mechanically flexible tunneling contact operating at radio frequencies. Appl Phys Lett. Dec. 1998;73(25):3751-3.

Feng et al., Low voltage nanoelectromechanical switches based on silicon carbide nanowires. Nano Lett. Aug. 11, 2010;10(8):2891-6. doi: 10.1021/nl1009734. Epub Jul. 16, 2010.

Gimzewski et al., Photon emission with the scanning tunneling microscope. Z Phys B.—Condensed Matter. 1988;72:497-501.

Holmlin et al., Electron transport through thin organic films in metal--insulator--metal junctions based on self-assembled monolayers. J Am Chem Soc. May 30, 2001;123(21):5075-85. Epub May 4, 2001.

Jang et al., Fabrication and characterization of a nanoelectromechanical switch with 15-nm-thick suspension air gap. Appl Phys Lett. 2008;92:103110(1-3). Epub Mar. 11, 2008.

Kern et al., Electrically-driven optical antennas. Nat Photon. Aug. 2015;9:582-6. 8 pages. Suppl Information, 13 pages.

Kim et al., Three-terminal nanoelectromechanical field effect transistor with abrupt subthreshold slope. Nano Lett. Feb. 2014;14(3):1687-91.

Lahann et al., A reversibly switching surface. Science. Jan. 17, 2003;299(5605):371-4. Erratum in: Science. May 9, 2003;300(5621):905.

Lambe et al., Light emission from inelastic electron tunneling. Phys Rev Lett. Oct. 4, 1976;37(14):923-5.

Lambrecht et al., Casimir force between metallic mirrors. Eur Phys J D. 2000;8:309-18.

Lassiter et al., Plasmonic waveguide modes of film-coupled metallic nanocubes. Nano Lett. 2013;13(12):5866-72. doi: 10.1021/nl402660s. Epub Nov. 7, 2013.

Lee et al., A sub-1-volt nanoelectromechanical switching device. Nat. Nanotechnol. Jan. 2013;8:36-40. Epub Nov. 25, 2012.

Li et al., Large-area synthesis of high-quality and uniform graphene films on copper foils. Science. Jun. 5, 2009;324(5932):1312-4. doi: 10.1126/science.1171245. Epub May 7, 2009.

Lifshitz, The theory of molecular attractive forces between solids. Sov Phys JETP. Jan. 1956;2(1):73-83.

Loh et al., Nanoelectromechanical contact switches. Nat Nanotechnol. May 2012;7(5):283-95. doi: 10.1038/nnano.2012.40. Epub Apr. 29, 2012.

Loh et al., Robust carbon-nanotube-based nano-electromechanical devices: Understanding and eliminating prevalent failure modes using alternative electrode materials. Small. Jan. 3, 2011;7(1):79-86. doi: 10.1002/smll.201001166.

London, The general theory of molecular forces. Trans Faraday Soc. Jan. 1937;33:8-26.

Maboudian et al., Critical review: Adhesion in surface micromechanical structures. J. Vac. Sci. Technol B. Jan./Feb. 1997;15(1):1-20.

Maboudian et al., Self-assembled monolayers as anti-stiction coatings for MEMS: characteristics and recent developments. Sensors and Actuators A: Physical. May 15, 2000;82(13):219-23.

Mann et al., Improving the binding characteristics of tripodal compounds on single layer graphene. ACS Nano. Aug. 27, 2013;7(8):7193-9. doi: 10.1021/nn402599x. Epub Jul. 16, 2013.

Moreau et al., Controlled-reflectance surfaces with film-coupled colloidal nanoantennas. Nature. Dec. 6, 2012;492(7427):86-9. doi: 10.1038/nature11615.

Nathanael et al, Four-terminal-relay technology for complementary logic. IEEE Int Electron Devices Meet (IEDM09), Tech Dig. 2009;223-6.

Niroui et al., Tunneling nanoelectromechanical switches based on compressible molecular thin films. ACS Nano. Aug. 25, 2015;9(8):7886-94. doi: 10.1021/acsnano.5b02476. Epub Aug. 5, 2015.

Niroui et al., Controlled fabrication of nanoscale gaps using stiction. Proc 28th IEEE Intl Conf Micro Electro Mech Syst (MEMS). Estoril, Portugal. Jan. 2015;2015:85-8, Author Manuscript.

Niroui et al., Nanoelectromechanical tunneling switches based on self-assembled molecular layers. 2014 IEEE 27th Intl Conf Micro Electro Mech Systems (MEMS 2014). San Francisco, CA. Jan. 2014;1103-6.

Niskala et al., Tunneling characteristics of Au-alkanedithiol-Au junctions formed via nanotransfer printing (nTP). J Am Chem Soc. Jul. 25, 2012;134(29):12072-82. doi: 10.1021/ja302602b. Epub Jun. 21, 2012.

Palasantzas et al., Transition from Casimir to van der Waals force between macroscopic bodies. Appl. Phys. Lett. 2008;93:121912(1-3).

Parzefall et al., Antenna-coupled photon emission from hexagonal boron nitride tunnel junctions. Nat Nanotechnol. Dec. 2015;10:1058-63. Epub Sep. 14, 2015.

Persson et al., Theory of photon emission in electron tunneling to metallic particles. Phys Rev Lett. May 25, 1992;68(21):3224-7.

Qian et al., A dual-silicon-nanowires based U-shape nanoelectromechanical switch with low pull-in voltage. Appl Phys Lett. 2012;100(11):113102(1-3) Epub Mar. 12, 2012.

Rampi et al., Alkanethiol self-assembled monolayers as the dielectric of capacitors with nanoscale thickness. Appl Phys Lett. Apr. 6, 1998;72(14):1781-3.

(56) References Cited

OTHER PUBLICATIONS

Reina et al, Large area, few-layer graphene films on arbitrary substrates by chemical vapor deposition. Nano Lett. Jan. 2009;9(1):30-5. doi: 10.1021/nl801827v. Epub Dec. 1, 2008.

Rodriguez et al., The Casimir effect in microstructured geometries. Nat Photon. Apr. 2011;5:211-21. Epub Mar. 31, 2011.

Rueckes et al., Carbon nanotube-based nonvolatile random access memory for molecular computing. Science. Jul. 7, 2000;289(5476):94-7.

Salomon et al., Comparison of electronic transport measurements on organic molecules. Adv Mater. Nov. 17, 2003;15(22):1881-90.

Schull et al., Electron-plasmon and electron-electron interactions at a single atom contact. Phys Rev Lett. Feb. 2009;102:057401(1-4).

Simmons, Generalized formula for the electric tunnel effect between similar electrodes separated by a thin insulating film. J Appl Phys. Jun. 1963;34(6):1793-1803.

Simmons, Electric tunnel effect between dissimilar electrodes separated by a thin insulating film. J Appl Phys. Sep. 1963;34(9):2581-90.

Sparks et al., Light emission from the slow mode of tunnel junctions on short period diffraction gratings. Phys Rev Lett. Apr. 1992;68(17):2668-71.

Suk et al., Transfer of CVD-grown monolayer graphene onto arbitrary substrates. ACS Nano. Sep. 2011;5(9):6916-24. doi: 10.1021/nn201207c. Epub Sep. 6, 2011.

Tomfohr et al., Complex band structure, decay lengths, and Fermi level alignment in simple molecular electronic systems. Phys Rev B. May 28, 2002;65:245105(1-12).

Unsworth et al., Chemisorption of thiolated poly(ethylene oxide) to gold: Surface chain densities measured by ellipsometry and neutron reflectometry. J Colloid Interface Sci. Jan. 1, 2005;281(1):112-21.

Wagner et al., Switch on, switch off: Stiction in nanoelectromechanical switches. Oxford Centre for Collaborative Applied Mathematics (OCCAM), University of Oxford, Feb. 6, 2013. 17 pages.

Wang et al., Mechanism of electron conduction in self-assembled alkanethiol monolayer devices. Phys Rev B. Jul. 17, 2003;68:035416(1-7).

Yaung et al., Adhesive force characterization for MEM logic relays with sub-micron contacting regions. J Microelectromech Syst. Feb. 2014;23(1):198-203.

International Search Report and Written Opinion dated Mar. 13, 2017 for Application No. PCT/US2016/065288.

International Preliminary Report on Patentability dated Jun. 21, 2018 for Application No. PCT/US2016/065288.

\* cited by examiner

ELECTRICALLY DRIVEN LIGHT-EMITTING TUNNEL JUNCTIONS

RELATED APPLICATIONS

This application is a national stage filing under 35 U.S.C. § 371 of International Application No. PCT/US2016/065288, filed Dec. 7, 2016, and entitled "ELECTRICALLY DRIVEN LIGHT-EMITTING TUNNEL JUNCTIONS", which claims priority under 35 U.S.C. § 119(e) to U.S. Provisional Patent Application Ser. No. 62/264,042, filed Dec. 7, 2015 and entitled "Electrically Driven Light-Emitting Tunnel Junctions", each of which is incorporated herein by reference in its entirety for all purposes.

FEDERALLY SPONSORED RESEARCH

This invention was made with Government support under Grant No. EECS0939514 awarded by the National Science Foundation. The Government has certain rights in the invention.

FIELD

The present invention relates generally to nanoscale devices that use a tunneling current to generate light emission.

BACKGROUND

There is a desire for improved light emitting devices for efficient optical communication and information processing, sensors and actuators, displays and other applications.

SUMMARY

Methods and articles related to light emitting devices as well as related components and methods associated therewith are provided. The subject matter of the present invention involves, in some cases, interrelated products, alternative solutions to a particular problem, and/or a plurality of different uses of one or more systems and/or articles.

In one embodiment, a device comprises a first electrode, a second electrode, and an insulator layer positioned between the first electrode and the second electrode. The insulator layer may be configured such that tunneling occurs between the first electrode and the second electrode when a voltage difference is established between the first electrode and the second electrode, and the insulator layer may be configured such that light emission occurs when tunneling occurs.

In another embodiment, a method of operating a device comprises applying a voltage such that a tunneling current is generated between a first electrode and a second electrode, wherein the generation of a tunneling current causes light to be emitted.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
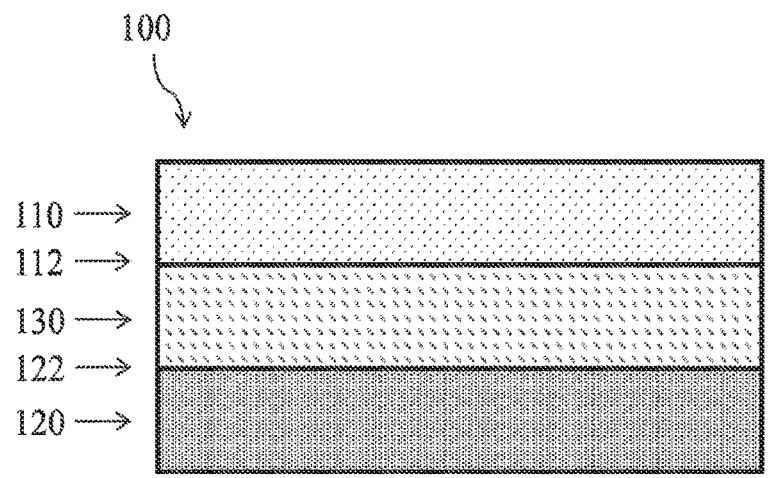
FIG. 1 shows, according to some embodiments, a schematic illustration of a device comprising a first electrode, a second electrode, and a layer positioned between the first electrode and the second electrode.

Articles and methods involving light emitting devices are generally provided. In some embodiments, a tunneling current flowing through a device causes light to be emitted by the device.

In some embodiments, light emission may occur at a plasmon resonance wavelength of the device. Without wishing to be bound by theory, a plasmon resonance is an oscillation of electrons at the surface or surfaces of a conductor under resonance conditions. Plasmon resonances occurring at surfaces in close proximity to each other may couple to produce a plasmon resonance characteristic of the structure.

In some embodiments, the device may have a plasmon resonance wavelength in the visible range (e.g., greater than or equal to 500 nm and less than or equal to 900 nm). In some embodiments, the device may have a plasmon resonance wavelength in the infrared range, or any other range. In some embodiments, a tunneling current may excite a plasmon resonance, and may cause light to be emitted at the plasmon resonance wavelength.

In certain embodiments, the devices include a first electrode and a second electrode. In some embodiments, the devices may include a first electrode, a second electrode, and a layer positioned between the first electrode and the second electrode. In some embodiments, the layer may be deformable while in other embodiments the layer may be non-deformable. In certain embodiments, the layer may be an insulator.

In some embodiments, a voltage applied to at least one of the first electrode and the second electrode may cause tunneling current to flow between the first electrode and the second electrode.

In some embodiments, it may be possible to vary the distance between the first electrode and the second electrode by deforming the layer positioned between the first electrode and the second electrode. The first electrode and the second electrode may be brought closer together, or may be moved further apart. In certain embodiments, changing the distance between the first electrode and the second electrode may cause the electrical and/or the optical properties of the device to change. For instance, the magnitude of the tunneling current between the first electrode and the second electrode may change as the distance between the first electrode and the second electrode changes, and/or the plasmon resonance wavelength of the device may change as the distance between the first electrode and the second electrode changes. In some embodiments, changing the magnitude of the tunneling current may change the intensity of the light that is emitted and changing the plasmon resonance wavelength of the device may change the wavelength of the light that is emitted.

In some embodiments, the device may comprise a deformable layer which may be compressed or expanded. Compression or expansion of the deformable layer may be caused by mechanical force on one or more of the electrodes. Such a force may be produced in any of a variety of ways. For example, the force may be produced electrically by establishing a voltage difference between the first electrode and the second electrode and/or by applying a charge to an electrode that generates a mirror charge in the opposing electrode. Alternatively or additionally, the force can be produced mechanically due to physical contact with an object, application of a pressure due to a fluid (e.g., a liquid or gas), and/or an acoustic wave that impinges on an electrode, merely by way of example. As another example, the force may be produced as a result of a chemical reaction that expands or compresses the deformable material. The force can also be produced as a result of the application of light and/or heat to one or more device components.

The devices disclosed herein may be used in many suitable applications. In certain embodiments, the device may be used as a sensor. For example, a change in the distance between the first electrode and the second electrode may cause a shift in the plasmon resonance wavelength and/or a change in the magnitude of the tunneling current. As another example, a change in the chemical composition of the layer positioned between the first electrode and the second electrode may cause a shift in the plasmon resonance wavelength and/or a change in the magnitude of the tunneling current. Shifting the plasmon resonance wavelength may shift the wavelength of the light emitted by the device and/or changing the magnitude of the tunneling current may cause a change in the intensity of the light emitted by the device.

In certain embodiments, the device may serve as an ultrafast light source. The device may be configured to emit light when tunneling occurs between the first electrode and the second electrode but not emit light in the absence of tunneling. Other applications, including on-chip applications, are also contemplated.

FIG. 1 shows one non-limiting embodiment of a device. Device 100 comprises first electrode 110, second electrode 120, and layer 130 positioned between the first electrode and the second electrode. As described above, in some embodiments layer 130 may be a deformable layer.

As used herein, the term electrode refers to a layer that is electronically conducting or semiconducting. In some embodiments, an electrical potential may be applied to one or more electrodes. In some embodiments, an electrical potential may not be applied to one or more electrodes (e.g., a potential may not be applied to first electrode 110, or a potential may not be applied to second electrode 120). In some embodiments, an electrical potential may not be applied to any electrodes (e.g., a potential may be applied to neither of first electrode 110 and second electrode 120).

In some embodiments, the first electrode 110 may be electrically isolated. As used herein, an electrode is electrically isolated when it is not in electrical communication with any other conductor, aside from the capability of exchanging a tunneling current with another electrode (e.g., second electrode 120). That is, the electrode is topologically surrounded by insulators.

In some embodiments, the first electrode 110 may be a mechanically floating electrode. As used herein, a mechanically floating electrode is an electrode that can move as layer 120 deforms. Without wishing to be bound by theory, mechanically floating electrodes may provide certain advantages, such as allowing for the use of top electrode materials that may be challenging to fabricate as non-mechanically floating electrodes, including smooth electrodes and/or electrodes with nanoscale dimensions. In some embodiments, mechanically floating electrodes may be capable of being moved across a distance with a lower input energy than otherwise equivalent non-floating electrodes. Such electrodes will be described in further detail below.

As described above, in some embodiments, the layer 130 positioned between the first electrode and the second electrode may be a deformable layer. As used herein, a deformable layer is a layer that is capable of undergoing a change in size (i.e., a deformation) during normal operation of the device. The deformation may be reversible, or the deformation may be non-reversible; that is, in some embodiments it may be possible for the deformable layer to return to its initial shape after deformation while in some embodiments it may not be possible for the deformable layer to return to its initial shape after deformation. In some embodiments, the layer 130 positioned between the first electrode and the second electrode may be a reversibly deformable layer, and may be capable of deforming under the influence of an applied force and then transforming back to its original shape once the force is removed. That is, the deformable layer may be capable of undergoing elastic deformation and/or functioning like a spring. Deformation of a deformable layer may comprise compression of the deformable layer such that the first electrode and the second electrode are brought closer together, or may comprise expansion of the deformable layer such that the first electrode and the second electrode are brought further apart. In some embodiments, the first layer 110 may float on the deformable layer, and the deformable layer may be capable of undergoing compression like a spring.

Figure 2:
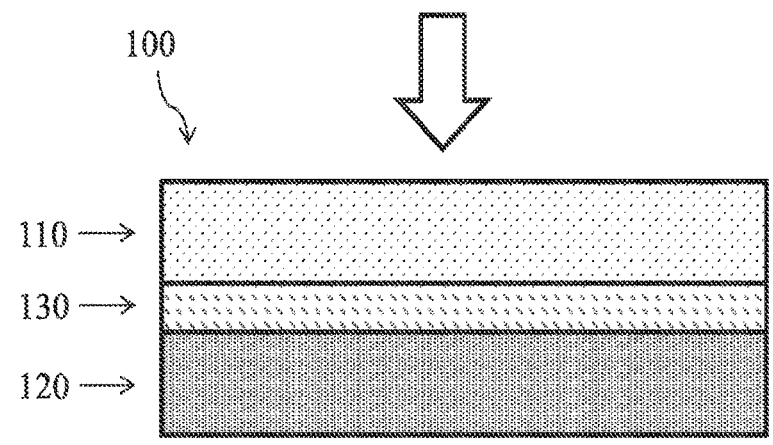
FIG. 2 shows, according to some embodiments, a schematic illustration of the application of force to a device.

In some embodiments, the layer positioned between the first electrode 110 and the second electrode 120 may be a deformable layer, and it may be possible to change the distance between the first electrode and the second electrode by applying a force to the first electrode, the second electrode, or both. FIG. 2 shows a schematic depiction of this process, showing the application of a force to device 100 such that layer 130 compressibly deforms so that top electrode 110 is brought closer to bottom electrode 120. In some, but not necessarily all, embodiments, device 100 may return to the configuration shown in FIG. 1 after removal of the force.

In some embodiments, changing the distance between the first electrode 110 and the second electrode 120 may be particularly advantageous. For example, the device may not be capable of supporting a tunneling current at a relatively large distance between the first electrode 110 and the second electrode 120 but may be capable of supporting a tunneling current at a sufficiently small distance between the first electrode 110 and the second electrode 120. Changing the distance between the first electrode 110 and the second electrode 120 may thus allow for tunneling between the first electrode 110 and the second electrode 120 to be switched on and off. Further examples of electromechanical switches are disclosed in International Patent Application No. PCT/US2014/013403, filed Jan. 28, 2014 and entitled "Electromechanical Device", herein incorporated by reference in its entirety for all purposes, are also contemplated.

In some embodiments, when placed in a closed switch position, the current that flows between the first electrode 110 and the second electrode 120 is greater than $10^{-8}$ A, greater than $10^{-7}$ A, greater than $10^{-6}$ A, greater than $10^{-5}$ A, greater than $10^{-4}$ A, greater than $10^{-3}$ A, greater than $10^{-2}$ A, greater than $10^{-1}$ A, greater than 1.0 A, between $10^{-8}$ A and 1.0 A, between $10^{-7}$ 10 A and $10^{-1}$ A, between $10^{-6}$ A and $10^{-2}$ A, or between $10^{-5}$ A and $10^{-3}$ A. The current (e.g., tunneling) that flows between the first electrode 110 and the second electrode 120 when the device is placed in a closed switch position may fall within ranges defined by any of the end points listed above, or may fall outside of the above-noted ranges.

Conversely, when the device is in an open switch position with the electrodes farther apart, the direct tunneling current that flows between the first electrode 110 and the second electrode 120 is negligible. In some embodiments, when placed in an open switch position, the current that flows between the first electrode 110 and the second electrode 120 is less than $10^{-6}$ A, less than $10^{-7}$ A, less than $10^{-8}$ A, less than $10^{-9}$ A, less than $10^{-10}$ A, less than $10^{-11}$ A, less than $10^{-12}$ A, less than $10^{-13}$ A, between $10^{-6}$ A and $10^{-13}$ A, between $10^{-7}$ A and $10^{-12}$ A, between $10^{-8}$ A and $10^{-11}$ A, or between $10^{-9}$ A and $10^{-10}$ A. The current that flows between first electrode 110 and the second electrode 120 when the device is placed in an open switch position may fall within ranges defined by any of the end points listed above, or may fall outside of the above-noted ranges.

In certain embodiments, the ratio of the tunneling current that flows between the first electrode 110 and the second electrode 120 when the switch is closed to the tunneling current that flows between the first electrode 110 and the second electrode 120 when the device is open is relatively high. In some embodiments, the ratio of the tunneling current that flows between the first electrode 110 and the second electrode 120 when the switch is closed to the tunneling current that flows between the first electrode and the second electrode when the device is open is greater than or equal to $10^3$ A, greater than or equal to $10^4$ A, greater than or equal to $10^5$ A, greater than or equal to $10^6$ A, or greater than or equal to $10^7$ A. In some embodiments, the ratio of the tunneling current that flows between the first electrode 110 and the second electrode 120 when the switch is closed to the tunneling current that flows between the first electrode 110 and the second electrode 120 when the device is open is less than or equal to $10^8$, less than or equal to $10^7$ A, less than or equal to $10^6$ A, less than or equal to $10^5$ A, or less than or equal to $10^4$. Combinations of the above-referenced ranges are also possible (e.g., greater than or equal to $10^4$ A and less than or equal to $10^8$ A). Other ranges are also possible.

In some embodiments, changing the distance between the first electrode 110 and the second electrode 120 (e.g., through deformation of a deformable layer positioned therebetween) may cause a change in the plasmon resonance wavelength. For instance, the device may have a first plasmon resonance wavelength at a first distance between the first electrode and the second electrode and a second plasmon resonance wavelength at a second distance between the first electrode 110 and the second electrode 120. In some embodiments, it may be advantageous to modify the plasmon resonance wavelength as desired, or to shift it from the first wavelength to the second wavelength and/or back from the second wavelength to the first wavelength. For instance, it may be beneficial to change the plasmon resonance wavelength from a non-visible wavelength to a visible wavelength or from a first visible wavelength to a second visible wavelength for display applications. As another example, it may be beneficial to change the plasmon resonance from a wavelength that is not of interest to a wavelength that is of interest (e.g., changing the wavelength from one which would not trigger an optical sensor to one which would trigger the optical sensor).

In some embodiments, the plasmon resonance wavelength of a device may be dependent on the material or materials used to form the device components, the indices of refraction of the device components, and the thickness of the layer 130.

In some embodiments, the first plasmon resonance wavelength (or the plasmon wavelength prior to deformation of the deformable layer) may be greater than or equal to 500 nm, greater than or equal to 550 nm, greater than or equal to 600 nm, greater than or equal to 650 nm, greater than or equal to 700 nm, greater than or equal to 750 nm, greater than or equal to 800 nm, greater than or equal to 850 nm, greater than or equal to 900 nm, greater than or equal to 1000 nm, greater than or equal to 1200 nm, greater than or equal to 1300 nm, greater than or equal to 1400 nm, or greater than or equal to 1500 nm. In some embodiments, the first plasmon resonance wavelength may be less than or equal to 1600 nm, less than or equal to 1500 nm, less than or equal to 1400 nm, less than or equal to 1300 nm, less than or equal to 1200 nm, less than or equal to 1000 nm, less than or equal to 900 nm, less than or equal to 850 nm, less than or equal to 800 nm, less than or equal to 750 nm, less than or equal to 700 nm, less than or equal to 650 nm, less than or equal to 600 nm, or less than or equal to 550 nm. Combinations of the above-referenced ranges are also possible (e.g., greater than or equal to 500 nm and less than or equal to 900 nm). Other ranges are also possible.

In some embodiments, the second plasmon resonance wavelength (or the plasmon wavelength after deformation of the deformable layer) may be greater than or equal to 500 nm, greater than or equal to 550 nm, greater than or equal to 600 nm, greater than or equal to 650 nm, greater than or equal to 700 nm, greater than or equal to 750 nm, greater than or equal to 800 nm, greater than or equal to 850 nm, greater than or equal to 900 nm, greater than or equal to 1000 nm, greater than or equal to 1200 nm, greater than or equal to 1300 nm, greater than or equal to 1400 nm, or greater than or equal to 1500 nm. In some embodiments, the second plasmon resonance wavelength may be less than or equal to 1600 nm, less than or equal to 1500 nm, less than or equal to 1400 nm, less than or equal to 1300 nm, less than or equal to 1200 nm, less than or equal to 1000 nm, less than or equal to 900 nm, less than or equal to 850 nm, less than or equal to 800 nm, less than or equal to 750 nm, less than or equal to 700 nm, less than or equal to 650 nm, less than or equal to 600 nm, or less than or equal to 550 nm. Combinations of the above-referenced ranges are also possible (e.g., greater than or equal to 500 nm and less than or equal to 900 nm). Other ranges are also possible.

In certain embodiments, the presence of a tunneling current between the first electrode 110 and the second electrode 120 may cause emission of light at the plasmon resonance wavelength of the device. Accordingly, in some embodiments the device may serve as an optical switch. That is, turning on a tunneling current may also turn on the emission of light from the device and turning off a tunneling current may turn off the emission of light from the device. In some embodiments, the layer 130 may be a deformable layer and changing the distance between the first electrode 110 and the second electrode 120 may both turn on light emission by turning on tunneling and change the plasmon resonance wavelength. In some embodiments, the layer 130 may not be a deformable layer and changing the voltage difference between the first electrode 110 and the second electrode 120 may turn on light emission by turning on the tunneling current but not change the plasmon resonance wavelength. Other configurations are also possible.

In some embodiments, generating a tunneling current or terminating a tunneling current may occur relatively rapidly. Rapid turning on and off of a tunneling current may allow for the emission of light to be rapidly turned on and off. This may be a useful property for ultrafast switches. In some embodiments, emission of light (e.g., at the plasmon resonance wavelength) may be switched on and off at a frequency of greater than or equal to 1 GHz, greater than or equal to 10 GHz, greater than or equal to 100 GHz, or greater than or equal to 1 THz. In some embodiments, emission of light (e.g., at the plasmon resonance wavelength) may be switched on and off at a frequency of less than or equal to 999 THz, less than or equal to 100 THz, less than or equal to 10 THz, less than or equal to 1 THz, less than or equal to 100 GHz, or less than or equal to 10 GHz. Combinations of the above-referenced ranges are also possible (e.g., greater than or equal to 1 GHz and less than or equal to 10 THz). Other ranges are also possible.

A force may be applied to either or both of the first electrode 110 and the second electrode 120 by any suitable means, non-limiting examples of which include externally-applied mechanical pressure (e.g., by use of a clamp, lever, pressure applicator, manual compression, pressure from a surrounding fluid or gas, and the like), and/or by mechanical pressure applied by the one or more device components upon response to a stimulus (e.g., a stimulus such as electric field, light, heat, magnetic field, chemical environment, biological reaction, and the like).

In some embodiments, it may be possible to apply a force to the first electrode 110 by applying a voltage to the second electrode 120. Without wishing to be bound by theory, applying a voltage to the second electrode 120 may induce a charge of opposite sign on the surface of the first electrode 110. This may cause the first electrode 110 to be attracted to the second electrode 120 by electrostatic attraction. The electrostatic attraction between the first electrode 110 and the second electrode 120 may cause a compressive force to be exerted on the deformable layer 130, and may cause it to deform such that the first electrode 110 is moved closer to the second electrode 120. Applying a voltage to the second electrode 120 without applying a voltage to the first electrode 110 may be preferred in some embodiments, such as when the first electrode 110 is electrically isolated. In some embodiments, applying a voltage to the first electrode 110, the second electrode 120, or both causes tunneling to flow between the first electrode 110 and the second electrode 120.

Any suitable voltage or charge may be applied to the second electrode 120 (i.e., the bottom electrode) to generate a voltage difference between the first electrode 110 and the second electrode 120. The voltage may be positive or negative. In some embodiments, a voltage difference between the first electrode 110 and the second electrode 120 may be sufficient to cause deformation of the deformable layer 130. In some embodiments, the voltage difference sufficient to cause deformation of the deformable layer 130 may be less than 1.0 V, less than 0.8 V, less than 0.5 V, less than 0.3 V, less than 100 mV, between 0.1 V and 1.0 V, between 0.1 V and 0.5 V, between 0.1 V and 0.3 V, etc. These voltage differences that result in suitable deformation may be appropriate for CMOS applications. Though, devices in accordance with the present disclosure may be suitable for use in other applications. In some embodiments, the magnitude of the voltage adequate to cause deformation of the deformable layer 130 is less than 15.0 V, less than 12.0 V, less than 10.0 V, less than 8.0 V, less than 6.0 V, less than 4.0 V, less than 2.0 V, less than 1.0 V, less than 100 mV, between 0.1 V and 10.0 V, between 0.5 V and 5.0 V, between 1.0 V and 5.0 V, or between 5.0 V and 10.0 V. It can be appreciated that a voltage difference appropriate to cause deformation of the deformable layer 130 may fall within ranges defined by any of the end points listed above, or may fall outside of the above-noted ranges.

In some embodiments, it may be possible to apply a force to the first electrode 110 by causing one or more molecules in the layer positioned between the first electrode and the second electrode 130 to undergo an electrically-induced conformational change. For example, charges may be inserted or extracted from the layer, and/or the layer may undergo a piezoelectric response to an applied voltage.

In some embodiments, it may be possible to apply a magnetic force to the first electrode 110. For instance, both first electrode 110 and second electrode 120 may comprise one or more magnetic components. If a magnetic field is induced electromagnetically or by the use of an external source, the first electrode 110 and the second electrode 120 may be attracted to each other.

In some embodiments, the application of temperature may cause a force to be applied to the first electrode 110. A change in temperature may cause a conformational change in one or more molecules positioned in layer 130, or it may drive an expansion or compression of layer 130 if there is a thermal expansion coefficient mismatch between layer 130 and either first electrode 110 or second electrode 120.

In some embodiments, the application of light may cause a force to be applied to the first electrode 110. Exposure of layer 130 to light may directly cause a conformational change of at least some of the molecules in the layer, or may indirectly cause a conformational change of at least some of the molecules in the layer by changing the temperature of the layer. In some embodiments, optical forces exerted by light may be sufficient to cause deformation of layer 130.

In some embodiments, it may be possible to apply a force to the first electrode 110 by applying a chemical stimulus or a biological stimulus to layer 130 that results in a conformational change of at least some of the molecules in layer 130.

In some embodiments, applying a force to the first electrode 110, the second electrode 120, or both may result in a relatively low amount of deformation of the deformable layer 130. This may result in a relatively small change in distance between the first electrode 110 and the second electrode 120. In some embodiments, it may be possible to change the distance between the first electrode 110 and the second electrode 120 by a distance of less than or equal to 90% of the initial thickness of layer 130, less than or equal to 80% of the initial thickness of layer 130, less than or equal to 70% of the initial thickness of layer 130, less than or equal to 60% of the initial thickness of layer 130, less than or equal to 50% of the initial thickness of layer 130, less than or equal to 40% of the initial thickness of layer 130, less than or equal to 30% of the initial thickness of layer 130, less than or equal to 20% of the initial thickness of layer 130, less than or equal to 10% of the initial thickness of layer 130, or less than or equal to 5% of the initial thickness of layer 130. In some embodiments, it may be possible to change the distance between the first electrode 110 and the second electrode 120 by a distance of greater than or equal to 2.5% of the initial thickness of layer 130, greater than or equal to 5% of the initial thickness of layer 130, greater than or equal to 10% of the initial thickness of layer 130, greater than or equal to 20% of the initial thickness of layer 130, greater than or equal to 30% of the initial thickness of layer 130, greater than or equal to 40% of the initial thickness of layer 130, greater than or equal to 50% of the initial thickness of layer 130, greater than or equal to 60% of the initial thickness of layer 130, greater than or equal to 70% of the initial thickness of layer 130, or greater than or equal to 80% of the initial thickness of layer 130. Combinations of the above-referenced ranges are also possible (e.g., greater than or equal to 2.5% of the initial thickness of layer 130 and less than or equal to 90% of the initial thickness of layer 130). Other ranges are also possible.

The first electrode 110 may be spaced at any distance from the second electrode 120 prior to applying a force to the first electrode 110, the second electrode 120, or both. In some embodiments, the distance between the first electrode 110 and the second electrode 120 prior to applying a force to the first electrode 110, the second electrode 120, or both may be greater than or equal to 3.0 nm, greater than or equal to 3.5 nm, greater than or equal to 4.0 nm, greater than or equal to 4.5 nm, greater than or equal to 5.0 nm, greater than or equal to 6.0 nm, greater than or equal to 7.0 nm, greater than or equal to 8.0 nm, greater than or equal to 9.0 nm, greater than or equal to 10.0 nm, greater than or equal to 20.0 nm, greater than or equal to 30.0 nm, greater than or equal to 40.0 nm, or greater. In some embodiments, the distance between the first electrode 110 and the second electrode 120 prior to applying a force to the first electrode 110, the second electrode 120, or both may be less than or equal to 50.0 nm, less than or equal to 40.0 nm, less than or equal to 30.0 nm, 20.0 nm, less than 15.0 nm, less than or equal to 10.0 nm, less than or equal to 9.0 nm, less than or equal to 8.0 nm, less than or equal to 7.0 nm, less than or equal to 6.0 nm, less than or equal to 5.0 nm, or less.

The first electrode 110 may be spaced at any distance from the second electrode 120 as a force is being applied to the first electrode 110, the second electrode 120, or both. In some embodiments, the distance between the first electrode 110 and the second electrode 120 as a force is being applied to the first electrode 110, the second electrode 120, or both may be less than or equal to 50.0 nm, less than or equal to 40.0 nm, less than or equal to 30.0 nm, less than or equal to 20.0 nm, less than or equal to 10.0 nm, less than or equal to 9.0 nm, less than or equal to 8.0 nm, less than or equal to 7.0 nm, less than or equal to 6.0 nm, less than or equal to 5.0 nm, less than or equal to 4.0 nm, less than or equal to 3.5 nm, less than or equal to 3.0 nm, less than or equal to 2.5 nm, less than or equal to 2.0 nm, less than or equal to 1.5 nm, less than or equal to 1.0 nm, less than or equal to 0.5 nm, or less. In some embodiments, the distance between the first electrode 110 and the second electrode 120 as a force is being applied to the first electrode 110, the second electrode 120, or both may be greater than or equal to 1.0 nm, greater than or equal to 2.0 nm, greater than or equal to 2.5 nm, greater than or equal to 3.0 nm, greater than or equal to 3.5 nm, greater than or equal to 4.0 nm, greater than or equal to 5.0 nm, greater than or equal to 6.0 nm, greater than or equal to 7.0 nm, greater than or equal to 8.0 nm, greater than or equal to 9.0 nm, greater than or equal to 10.0 nm, greater than or equal to 20.0 nm, greater than or equal to 30.0 nm, greater than or equal to 40.0 nm, or greater.

Figure 3:
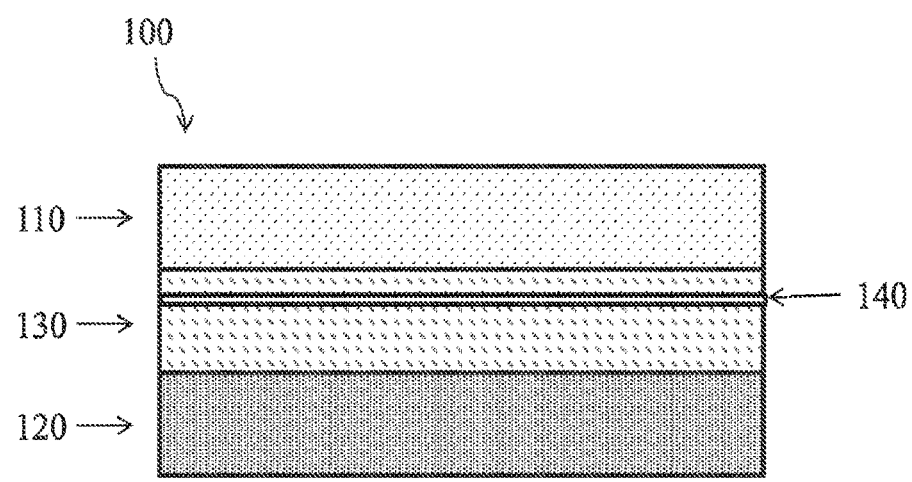
FIG. 3 shows, according to some embodiments, a schematic illustration of a device comprising a first electrode, a second electrode, a layer positioned between the first electrode and the second electrode, and a conductive layer positioned within the layer positioned between the first electrode and the second electrode.
Figure 4:
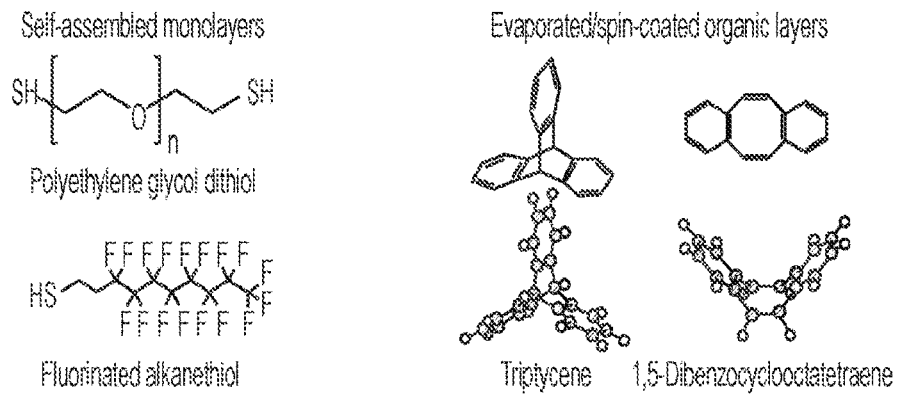
FIG. 4 shows, according to some embodiments, various materials that may be employed in electromechanical devices.

In some embodiments, the deformable layer 130 may comprise a conductive layer positioned within the bulk of the layer 130 positioned between the first electrode and the second electrode. FIG. 3 illustrates one such embodiment, where layer 130 comprises conducive layer 140. The conductive layer 140 may comprise a film that is conductive (e.g., a metal film), or it may comprise a region of the layer positioned between the first electrode 110 and the second electrode 120 that is conductive (e.g., the layer positioned between the first electrode 110 and the second electrode 120 may comprise molecules with a conductive region, and the conductive regions may positioned with respect to each other such that a conductive layer is formed). In such embodiments, the distance between the first electrode 110 and the second electrode 120 prior to applying a force to the first electrode 110, the second electrode 120, or both and/or while applying a force to the first electrode 110, the second electrode 120, or both may be a multiple of one of the numbers above. That is, the numbers above should be taken to refer to distances between conductive layers in addition to distances between electrodes. Without wishing to be bound by theory, the presence of a conductive layer within the deformable layer 130 may allow for tunneling between the first electrode 110 and the second electrode 120 through the conductive layer 140. In other words, tunneling currents may be established between both the first electrode 110 and the conductive layer 140 and between the conductive layer 140 and the second electrode 120 simultaneously. This may allow for the first electrode 110 and the second electrode 120 to be spaced farther apart while still allowing for tunneling.

In some embodiments, the deformable layer 130 may be capable of undergoing a desirable amount of deformation while being subject to a relatively low amount of pressure. In some such embodiments, the deformable layer 130 may have a relatively low Young's modulus. In some embodiments, the deformable layer 130 may have a Young's modulus of less than 15.0 MPa, less than 10.0 MPa, less than 9.0 MPa, less than 8.0 MPa, less than 7.0 MPa, less than 6.5 MPa, less than 6.0 MPa, less than 5.5 MPa, less than 5.0 MPa, less than 4.0 MPa, less than 3.0 MPa, less than 2.0 MPa, less than 1.0 MPa, etc. For example, the deformable layer may have a Young's modulus of between 1.0 MPa and 6.5 MPa, between 2.0 MPa and 6.0 MPa, between 1.0 MPa and 3.0 MPa, between 3.0 MPa and 5.0 MPa, between 5.0 MPa and 10.0 MPa or other ranges between end values provided herein. In certain embodiments, the deformable layer 130 may have a relatively higher Young's modulus. In some embodiments, the deformable layer 130 may have a Young's modulus of less than 150.0 MPa, less than 120.0 MPa, less than 100.0 MPa, less than 90.0 MPa, less than 80.0 MPa, less than 70.0 MPa, less than 60.0 MPa, less than 50.0 MPa, less than 40.0 MPa, less than 30.0 MPa, less than 20.0 MPa, less than 10.0 MPa, etc. For example, the deformable layer 130 may have a Young's modulus of between 1.0 MPa and 100.0 MPa, between 5.0 MPa and 50.0 MPa, between 10.0 MPa and 20.0 MPa, or other ranges between end values provided herein. It can be appreciated that the deformable layer 130 may exhibit a Young's modulus that falls outside of the above-noted ranges. The stiffness of the deformable layer 130 may be measured by methods known in the art, for example, by current-voltage extrapolation, interferometry measurements, atomic force microscopy, or other suitable techniques. In some embodiments, deformable layer 130 may have linear mechanical properties, or may behave like a spring (i.e., the Young's modulus may be considered to be analogous to spring constant of the layer). In other embodiments, deformable layer 130 may have non-linear mechanical properties. That is, the Young's modulus may not be constant during compression and expansion of deformable layer 130.

In certain embodiments, the first electrode 110 may have one or more beneficial material properties, such as a very low level of surface roughness. Without wishing to be bound by theory, it is believed that low levels of surface roughness may be advantageous for one or more regions. For instance, low levels of surface roughness may enable the distance between the first electrode 110 and the second electrode 120 to be relatively constant across the surface of the first electrode, which may result in more uniform electrical and/or optical properties. In some embodiments, low levels of surface roughness of the first electrode 110 may be achieved by employing a single crystalline material for the first electrode. In certain embodiments, the first electrode may comprise a single crystalline material with a crystal facet oriented parallel to surface 122. The crystal facet may be atomically smooth; that is, it may be a crystal plane with minimal or no defects. In some embodiments, the first electrode 110 may have a surface roughness of less than or equal to 1 nm, less than or equal to 0.9 nm, less than or equal to 0.8 nm, less than or equal to 0.7 nm, less than or equal to 0.6 nm, less than or equal to 0.5 nm, less than or equal to 0.4 nm, less than or equal to 0.3 nm, or less than or equal to 0.2 nm. In some embodiments, the first electrode 110 may have a surface roughness of greater than or equal to 0.1 nm, greater than or equal to 0.2 nm, greater than or equal to 0.3 nm, greater than or equal to 0.4 nm, greater than or equal to 0.5 nm, greater than or equal to 0.6 nm, greater than or equal to 0.7 nm, greater than or equal to 0.8 nm, or greater than or equal to 0.9 nm. Combinations of the above-referenced ranges are also possible (e.g., greater than or equal to 0.1 nm and less than or equal to 0.5 nm). Other ranges are also possible. In certain embodiments, the surface roughness may be less than or equal to half of the distance between the first electrode 110 and the second electrode 120. The surface roughness of the first electrode may be determined by atomic force microscopy.

The first electrode 110 may comprise any suitable material. In some embodiments, the first electrode 110 may comprise a two-dimensional material or a stack of two dimensional materials. As used herein, a two-dimensional material is a material that extends macroscopically in two dimensions but has sub-nanometer scale dimensions in a third dimension. One non-limiting example of a two-dimensional material is graphene.

In some embodiments, the first electrode 110 may comprise a nanomaterial. As used herein, a nanomaterial is a material that has at least one side length or diameter that is less than 200 nm. Non-limiting examples of nanomaterials include nanocubes (nanomaterials which have a cubic shape) and nanoplates (nanomaterials that are significantly thinner in one dimension than in the other two). In some embodiments, the first electrode 110 may comprise a nanocube and the nanocube side length may be greater than or equal to 50 nm, greater than or equal to 75 nm, greater than or equal to 100 nm, greater than or equal to 125 nm, greater than or equal to 150 nm, or greater than or equal to 175 nm. In some embodiments, the first electrode 110 may comprise a nanocube and the nanocube side length may be less than or equal to 200 nm, less than or equal to 175 nm, less than or equal to 150 nm, less than or equal to 125 nm, less than or equal to 100 nm, or less than or equal to 75 nm. Combinations of the above-referenced ranges are also possible (e.g., greater than or equal to 50 nm and less than or equal to 200 nm). Other ranges are also possible. The nanocube side length may be determined by measurement using scanning electron microscopy, transmission electron microscopy, atomic force microscopy and/or optical interferometry.

In some embodiments, the first electrode 120 may comprise a metal, a semiconductor, or a semimetal. In certain embodiments, the first electrode 110 may comprise a transition metal. In some embodiments, the first electrode may comprise gold. In some embodiments, it may be preferred for the first electrode 110 to comprise a gold nanocube.

In certain embodiments, the second electrode 120 may have one or more beneficial materials properties, such as a very low level of surface roughness. In some embodiments, low levels of surface roughness of the second electrode 120 may be achieved by employing a single crystalline material for the second electrode 120. In certain embodiments, the second electrode 120 may comprise a single crystalline material with a crystal facet oriented parallel to surface 112. The crystal facet may be atomically smooth; that is, it may be a crystal plane with minimal or no defects. In some embodiments, the second electrode 120 may have a surface roughness of less than or equal to 1 nm, less than or equal to 0.9 nm, less than or equal to 0.8 nm, less than or equal to 0.7 nm, less than or equal to 0.6 nm, less than or equal to 0.5 nm, less than or equal to 0.4 nm, less than or equal to 0.3 nm, or less than or equal to 0.2 nm. In some embodiments, the second electrode 120 may have a surface roughness of greater than or equal to 0.1 nm, greater than or equal to 0.2 nm, greater than or equal to 0.3 nm, greater than or equal to 0.4 nm, greater than or equal to 0.5 nm, greater than or equal to 0.6 nm, greater than or equal to 0.7 nm, greater than or equal to 0.8 nm, or greater than or equal to 0.9 nm. Combinations of the above-referenced ranges are also possible (e.g., greater than or equal to 0.1 nm and less than or equal to 0.5 nm). Other ranges are also possible. The surface roughness of the second electrode may be determined by atomic force microscopy.

The second electrode 120 may comprise any suitable material. In some embodiments, the second electrode 120 may comprise a two-dimensional material or a stack of two dimensional materials. In some embodiments, the second electrode 120 may comprise graphene. In certain embodiments, it may be preferable for both the first electrode 110 and the second electrode 120 to comprise graphene.

In some embodiments, the second electrode 120 may comprise a nanomaterial, such as a nanocube or a nanoplate. In certain embodiments, it may be preferable for the first electrode 110 to comprise a nanocube and the second electrode 120 to comprise a nanoplate.

In some embodiments, the second electrode 120 may comprise a metal, a semiconductor, or a semimetal. In certain embodiments, the second electrode 120 may comprise a transition metal. In some embodiments, the second electrode 120 may comprise gold. In some embodiments, the second electrode 120 may comprise a gold nanoplate.

The layer 130 positioned between the first electrode 110 and the second electrode 120 may have any suitable composition. In some embodiments, the layer 130 positioned between the first electrode 110 and the second electrode 120 may be an insulator. In some embodiments, the layer 130 positioned between the first electrode 110 and the second electrode 120 may comprise both conductive and insulating molecules, or both conductive nanomaterials and insulating molecules. The insulating molecules may be mixed with the conductive molecules and/or with the conductive nanomaterials, or the conductive molecules and/or nanomaterials may take the form of a conductive layer or layers dispersed within an insulating layer.

In some embodiments, the layer 130 positioned between the first electrode 110 and the second electrode 120 may comprise one or more molecules that are responsive to a stimuli such as electrical stimuli, optical stimuli, chemical stimuli, and/or thermal stimuli.

In some embodiments, the layer 130 positioned between the first electrode 110 and the second electrode 120 may comprise one or more organic molecules. FIGS. 4-7 provide examples of suitable materials for the layer 130 positioned between the first electrode 110 and the second electrode 120, or organic thin film molecules, that may be incorporated in electromechanical devices described herein. In some embodiments, the layer 130 positioned between the first electrode 110 and the second electrode 120 may include molecules that form a self-assembled monolayer (SAM). In some embodiments, the molecules may include one or more functional groups that are capable of forming bonds with either or both of electrode 110 and electrode 120. Non-limiting examples of such groups include thiol groups, which may form covalent bonds with gold electrodes via gold-sulfur bonds. In some embodiments, the SAM may be comprise at least one of polyethylene glycol thiol, polyethylene glycol dithiol, and fluorinated alkanethiol. In some embodiments, at least a portion of the molecules forming the SAM may include at least two functional groups, so that they may be capable of forming bonds with both electrodes.

In some embodiments, molecules making up the layer 130 positioned between the first electrode 110 and the second electrode 120 (e.g., self-assembled monolayers) may have a length of at least 1 nm, at least 2 nm, at least 3 nm, at least 4 nm, at least 5 nm, at least 7 nm, at least 10 nm, or other suitable length. Or, the molecules may have a length of less than 25 nm, less than 20 nm, less than 15 nm, less than 10 nm, or less than 5 nm, etc. The molecules of the layer 130 positioned between the first electrode 110 and the second electrode 120 may have a length that falls within ranges defined by any of the end points described above, or may fall outside of the above noted ranges.

As noted herein, the density of the molecules in a self-assembled monolayer may also be appropriately tailored. For example, a self-assembled monolayer may have a relatively low packing density, allowing the organic layer to exhibit a suitably low stiffness. In some embodiments, the packing density of a self-assembled monolayer for an elastically deformable material may be between 20% and 80%, between 30% and 70%, between 40% and 60% (e.g., approximately 50%), etc., or suitable for the layer 130 positioned between the first electrode 110 and the second electrode 120 to compress in an appropriate manner. It can be appreciated that such molecules may also have functional groups that will affect their overall stiffness. For instance, in some cases, fluorinated alkane thiol molecules may be employed, resulting in relatively straight molecular chains due to mutual repulsion of fluorine atoms from one another. Such self-assembled monolayers may be formed using a mixture of fluorinated thiols and semifluorinated thiols, such as those shown in FIGS. 5-6.

Approaches in accordance with the present disclosure may give rise to a self-assembled monolayer that has a relatively dense collection of fluorine atoms on one side with a sparsely packed alkyl self-assembled monolayer located on an opposite side. The densely packed fluorous region may be relatively rigid, stabilizing the self-assembled monolayer so as to promote self-assembly. The sparse alkyl portion, on the other hand, may allow for compression of the overall layer by, for example, increasing the void space. As alkyl and perfluoroalkyl molecules exhibit generally unfavorable intermolecular forces (repulsive) with respect to one another, the open switch position of the device will be thermodynamically favored. In other words, when the device is actuated to a closed switch position, where alkyl and perfluoroalkyl molecules are bunched together, the repulsive nature of the molecules promote recovery, allowing the open switch position to be restored upon removal of the actuation voltage/force.

In some embodiments, the layer 130 positioned between the first electrode 110 and the second electrode 120 may include an evaporated or spin-coated organic layer, such as triptycene, dibenzocyclooctatetraene, or any other suitable molecule. Such molecules may exhibit generally 3D structures, which may naturally nestle amongst one another as the thin film is squeezed or otherwise compressed. These materials may also have properties such that the tunneling barrier between electrodes changes when the molecule is compressed or that the plasmon resonance of the device is changed when the molecule is compressed. For example, the tunneling bather threshold therethrough may be substantially lowered upon compression of the molecule(s). In such cases, despite the possibility for the molecule(s) of the layer positioned between the first electrode 110 and the second electrode 120 to be relatively stiff, the molecule(s) may undergo a conformational change upon compression, resulting in a substantial tunneling current to arise between electrodes. As another example, the compression of the molecules will result in a reduction in distance between first electrode 110 and second electrode 120, which will change the coupling between the surface plasmon resonances of these electrodes and thus change the plasmon resonance of the device.

Figure 5:
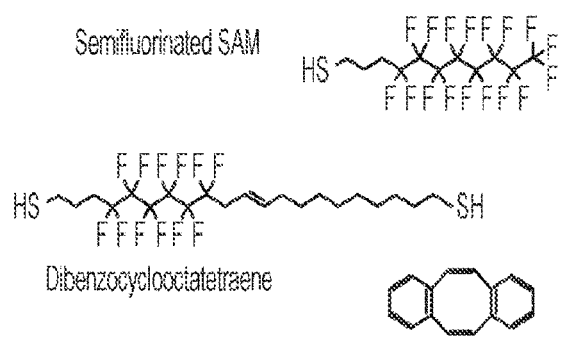
FIG. 5 shows, according to some embodiments, various materials that may be employed in electromechanical devices.
Figure 6:
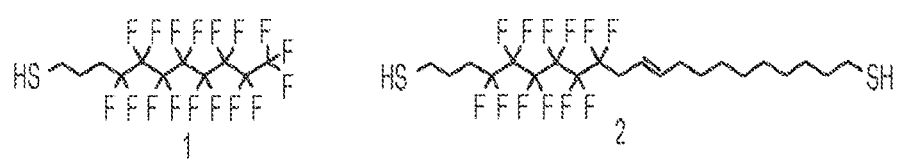
FIG. 6 shows, according to some embodiments, various materials that may be employed in electromechanical devices.
Figure 7:
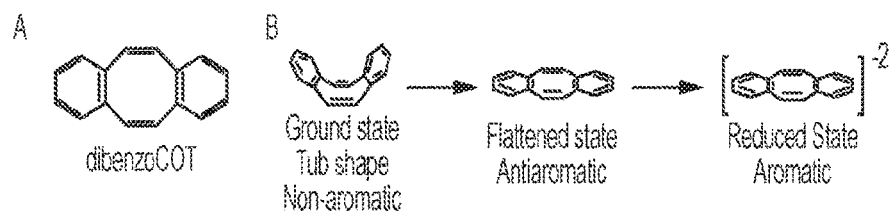
FIG. 7 shows, according to some embodiments, various materials that may be employed in electromechanical devices.

Dibenzocyclooctatetraene (dibenzoCOT), shown in FIGS. 5 and 7, is a small-molecule, which takes on an arched, tub-like shape in its ground state so as to avoid an unfavorable anti-aromatic thermodynamic state. However, dibenzoCOT can be forced to a substantially flattened anti-aromatic state as shown in FIG. 7. This results in a conformational change in structure where a significant restoring force is generated due to the chemical instability of the anti-aromatic system.

As described above, when the electrodes are brought closer together, the tunneling length therebetween decreases. When the elastically deformable layer includes dibenzoCOT, the tunneling barrier may be further decreased, as dibenzoCOT, in a compressed flat state, may allow for the overlap of delocalized cyclic pi-systems. That is, the compressed dibenzoCOT may allow for a greater amount of current therethrough than when in the arched tub-like shape. Accordingly, when compressed, the presence of dibenzoCOT may increase the total current between electrodes as they are brought closer together.

Among other small organic molecules that may be used to develop electromechanical devices in accordance with the present disclosure are tris-(8-hydroxyquinoline)aluminum (alq3), triptycene and triptycene derivatives. The chemical structures of these molecules may give rise to a tendency for the molecules to form thin-films having a relatively low packing density. When such molecules exhibit a low packing density, the formed layer may possess a relatively low stiffness, allowing for low voltage actuation of the device from open to closed switch positions.

The layer 130 positioned between the first electrode 110 and the second electrode 120 may include any other suitable composition. In various embodiments, the elastically deformable material may include dendrimers (e.g., repetitively branched molecules often substantially symmetric around a core), star polymers, biopolymers (e.g., collagen, carbohydrates, peptides, etc.), hydrogen-bonded matrices, organic nanoparticles, modified carbon nanotubes, redox-sensitive polymers, or other appropriate material.

It should be understood that the layer 130 positioned between the first electrode 110 and the second electrode 120 is not limited to the compositions discussed herein, as the use of other suitable compositions are within the scope of the present disclosure.

In some embodiments, the layer positioned between the first electrode 110 and the second electrode 120 is bonded to one or both of the first electrode 110 and the second electrode 120. The layer 130 positioned between the first electrode 110 and the second electrode 120 may be bonded to an electrode by any suitable means, such as by a non-covalent interaction, by a covalent interaction, by a hydrophobic-hydrophilic interaction, and by electrostatic attraction. In some embodiments, layer 130 positioned between the first electrode 110 and the second electrode 120 is bonded to an electrode by one or more of an adamantane-cyclodextrin interaction and a gold-thiol interaction.

In some embodiments, the device may further comprise a third electrode, a fourth electrode, or more electrodes. It should be understood that any of the properties described above in relation to two electrode devices may also be present for devices comprising three, four, or more electrodes. For example, the device may function as an electromechanical switch, tunneling may be selectively turned off and on by modulating the distance between the first electrode and the second and third electrodes, and/or the plasmon resonance may be tuned by modulating the distance between the first electrode and the second and third electrodes.

Figure 8:
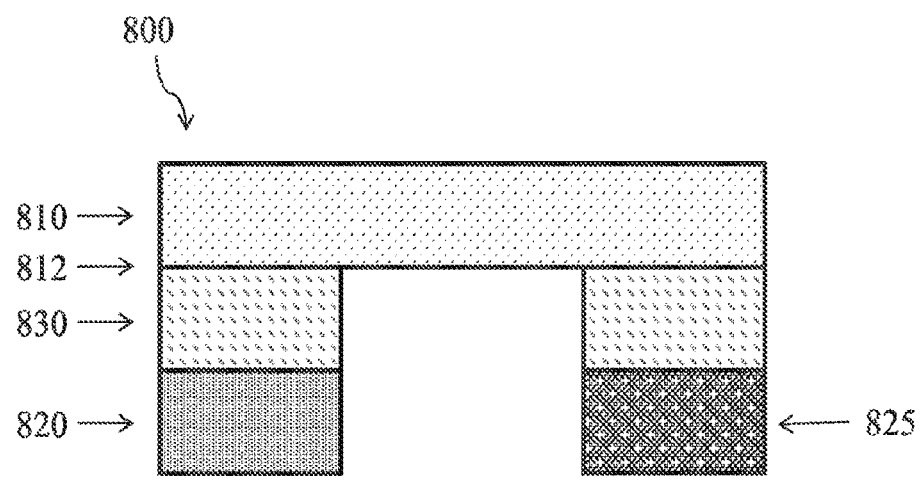
FIG. 8 shows, according to some embodiments, a schematic illustration of a device comprising three electrodes.

In certain embodiments, the device comprises a third electrode (or a fourth electrode) and the third electrode (or fourth electrode) is positioned on a side of the layer positioned between the first electrode and the second electrode opposite the first electrode (e.g., a side of the deformable layer opposite the first electrode). In some embodiments, the first electrode bridges the second electrode and the third electrode. FIG. 8 shows one non-limiting example of a device, where device 800 comprises first layer 810, second electrode 820, third electrode 825, and layer 830. Although FIG. 8 shows layer 830 as being present in the regions of space directly between first electrode 810 and second electrode 820 and between first electrode 810 and third electrode 825 but not in any other region of space, other configurations of the layer and the electrode are also possible (e.g., any portion or no portion of the region of space between first electrode 810 and second electrode 820, any portion or no portion of the region of space between first electrode 810 and second electrode 825, and/or any portion or no portion of the region of space not directly between any electrodes). In some embodiments, it may be preferable for the first electrode 810 to be both mechanically floating and electrically isolated.

In some embodiments, the device may comprise a third electrode 825 and may be a two terminal device. That is, the device may comprise two points at which electrical contact can be made. In some embodiments, the two terminals are the second electrode 820 and the third electrode 825. In some such embodiments, the second electrode 820 may be the source and the third electrode 825 may be the drain. A voltage difference may be established between the second electrode 820 and the third electrode 825 that causes a tunneling current to flow from the second electrode 820 to the first electrode 810, and from the first electrode 810 to the third electrode 825.

Figure 9:
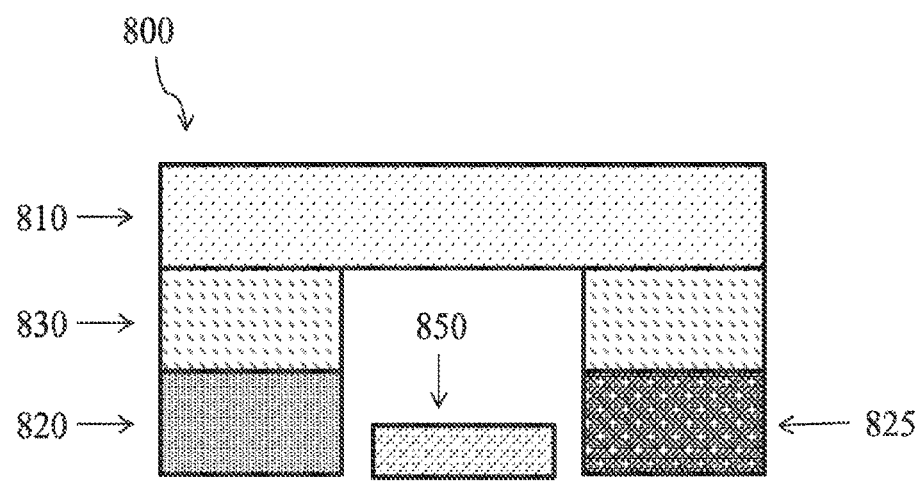
FIG. 9 shows, according to some embodiments, a schematic illustration of a device comprising four electrodes.

In some embodiments, the device may comprise three electrodes and may be a three terminal device. One example of a three terminal device is a device that can be operated in a similar manner to a MOSFET, as shown illustratively in FIG. 9. Without wishing to be bound by theory, a MOSFET device is a device comprising a source, a drain, and a gate. The gate may control the level of current that flows between the source and the drain. As shown in FIG. 9, a MOSFET may comprise first electrode 810, second electrode 820, third electrode 825, and gate 850. Applying a charge to the gate 850 produces an image charge in electrode 810 that produces an electrostatic force that pulls electrode 810 closer to the source electrode 820 and the drain electrode 825. When the distance is small enough, a tunneling current flows between the source electrode 820 and the electrode 810 and between the electrode 810 and the drain electrode 825.

Figure 10:
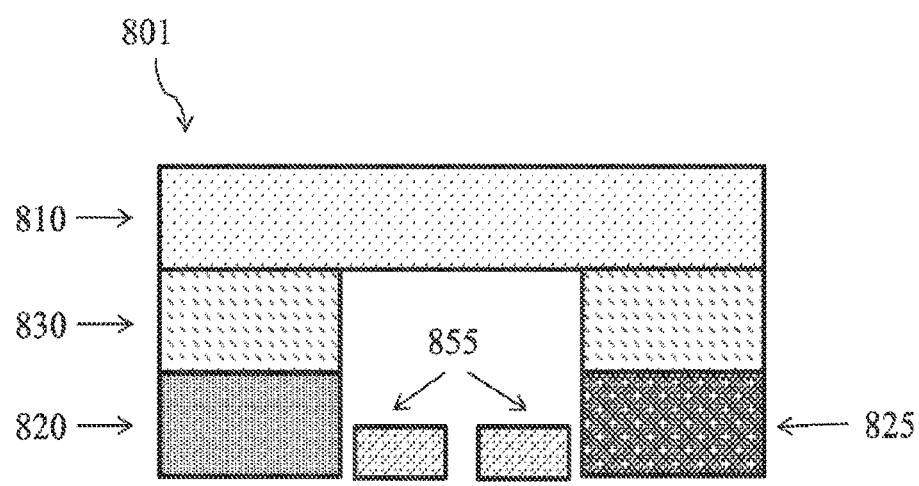
FIG. 10 shows, according to some embodiments, a schematic illustration of a split gate device.

In some embodiments, the MOSFET may be a split drain device. For example, the first electrode may be the source electrode and the second and third electrodes may be the drain electrodes. In some embodiments, the device is a MOSFET device with a split gate. One non-limiting example of such a device is shown in FIG. 10, where device 801 comprises first electrode 810, second electrode 820, third electrode and split gate 855. Other MOSFETs are also contemplated, as are other three terminal devices.

In certain embodiments, the third electrode 825 may have one or more beneficial materials properties, such as a very low level of surface roughness. In some embodiments, low levels of surface roughness of the third electrode 825 may be achieved by employing a single crystalline material for the third electrode 825. In certain embodiments, the third electrode 825 may comprise a single crystalline material with a crystal facet oriented parallel to surface 812. The crystal facet may be atomically smooth; that is, it may be a crystal plane with minimal or no defects. In some embodiments, the third electrode 825 may have a surface roughness of less than or equal to 1 nm, less than or equal to 0.9 nm, less than or equal to 0.8 nm, less than or equal to 0.7 nm, less than or equal to 0.6 nm, less than or equal to 0.5 nm, less than or equal to 0.4 nm, less than or equal to 0.3 nm, or less than or equal to 0.2 nm. In some embodiments, the third electrode 825 may have a surface roughness of greater than or equal to 0.1 nm, greater than or equal to 0.2 nm, greater than or equal to 0.3 nm, greater than or equal to 0.4 nm, greater than or equal to 0.5 nm, greater than or equal to 0.6 nm, greater than or equal to 0.7 nm, greater than or equal to 0.8 nm, or greater than or equal to 0.9 nm. Combinations of the above-referenced ranges are also possible (e.g., greater than or equal to 0.1 nm and less than or equal to 0.5 nm). Other ranges are also possible. The surface roughness of the second electrode may be determined by atomic force microscopy.

The third electrode 825 may comprise any suitable material. In some embodiments, the third electrode 825 may comprise a two-dimensional material or a stack of two dimensional materials. In some embodiments, the third electrode 825 may comprise graphene. In certain embodiments, it may be preferable for each of the first electrode 810, the second electrode 820, and the third electrode 825 to comprise graphene.

In some embodiments, the third electrode 825 may comprise a nanomaterial, such as a nanocube or a nanoplate. In certain embodiments, it may be preferable for the first electrode 810 to comprise a nanocube and both the second and third electrodes 820 and 825 to comprise nanoplates.

In some embodiments, the third electrode 825 may comprise a metal, a semiconductor, or a semimetal. In certain embodiments, the third electrode 825 may comprise a transition metal. In some embodiments, the third electrode 825 may comprise gold. In some embodiments, the third electrode 825 may comprise a gold nanoplate.

In some embodiments, the third electrode 825 may be positioned at a distance from the second electrode 820 that is advantageous for one or more applications. For example, in some embodiments the third electrode 825 may be positioned sufficiently far from the second electrode 820 that tunneling will not occur between the second electrode 820 and the third electrode 825 (e.g., the distance between the second electrode 820 and the third electrode 825 may be greater than the distance between the second electrode 820 and the first electrode 810). This may force the tunneling current to flow from the second electrode 820 through the first electrode 810 to the third electrode 825. In certain embodiments, the third electrode 825 may be positioned at a distance from the second electrode 820 such that the optical properties are enhanced. For instance, the distances between the first, second, and third electrodes 810, 820, and 825 may be selected so that the plasmon resonance is an appropriate value when the layer 830 positioned between the first electrode 810 and the second electrode 820 is undeformed and/or when the layer 830 positioned between the first electrode 810 and the second electrode 820 is deformed. In some embodiments, third electrode 825 is positioned sufficiently far from second electrode 820 in comparison to the distance between first electrode 810 and second electrode 820 such that the plasmon resonance of the device is dominated by the distance between first electrode 810 and second electrode 820. In some other embodiments, third electrode 825 may be positioned relatively close to second electrode 820. In either case, the plasmon resonance will shift when the layer 830 is deformed.

In some embodiments, the distance between the second electrode 820 and the third electrode 825 in the plane of the second electrode 820 may be less than or equal to 200 nm, less than or equal to 100 nm, less than or equal to 75 nm, less than or equal to 50 nm, less than or equal to 40 nm, less than or equal to 30 nm, less than or equal to 20 nm, or less than or equal to 10 nm. In some embodiments, the distance between the second electrode 820 and the third electrode 825 may be greater than or equal to 5 nm, greater than or equal to 10 nm, greater than or equal to 20 nm, greater than or equal to 30 nm, greater than or equal to 40 nm, greater than or equal to 50 nm, greater than or equal to 75 nm, or greater than or equal to 100 nm. Combinations of the above-referenced ranges are also possible (e.g., less than or equal to 100 nm and greater than or equal to 5 nm). Other ranges are also possible.

In some embodiments, the distance between the first electrode 810 and the second electrode 820 may be fairly close to the distance between the first electrode 810 and the third electrode 825. In certain embodiments, the distance between the first electrode 810 and the second electrode 820 may be within 1% of the distance between the first electrode 810 and the second electrode 825, within 2% of the distance between the first electrode 810 and the second electrode 825, within 5% of the distance between the first electrode 810 and the second electrode 825, within 10% of the distance between the first electrode 810 and the second electrode 825, or within 20% of the distance between the first electrode 810 and the second electrode 825.

In certain embodiments, a fourth and or fifth electrode may be present, and the fourth and/or fifth electrode (e.g., electrode 850, electrodes 855) may have one or more beneficial materials properties, such as a very low level of surface roughness. In some embodiments, low levels of surface roughness of the fourth and/or fifth electrode (e.g., electrode 850, electrodes 855) may be achieved by employing a single crystalline material for the fourth and/or fifth electrode (e.g., electrode 850, electrodes 855). In certain embodiments, the fourth and/or fifth electrode (e.g., electrode 850, electrodes 855) may comprise a single crystalline material with a crystal facet oriented parallel to surface 812. The crystal facet may be atomically smooth; that is, it may be a crystal plane with minimal or no defects. In some embodiments, the fourth and/or fifth electrode (e.g., electrode 850, electrodes 855) may have a surface roughness of less than or equal to 1 nm, less than or equal to 0.9 nm, less than or equal to 0.8 nm, less than or equal to 0.7 nm, less than or equal to 0.6 nm, less than or equal to 0.5 nm, less than or equal to 0.4 nm, less than or equal to 0.3 nm, or less than or equal to 0.2 nm. In some embodiments, the fourth and/or fifth electrode (e.g., electrode 850, electrodes 855) may have a surface roughness of greater than or equal to 0.1 nm, greater than or equal to 0.2 nm, greater than or equal to 0.3 nm, greater than or equal to 0.4 nm, greater than or equal to 0.5 nm, greater than or equal to 0.6 nm, greater than or equal to 0.7 nm, greater than or equal to 0.8 nm, or greater than or equal to 0.9 nm. Combinations of the above-referenced ranges are also possible (e.g., greater than or equal to 0.1 nm and less than or equal to 0.5 nm). Other ranges are also possible. The surface roughness of the fourth and/or fifth electrode (e.g., electrode 850, electrodes 855) may be determined by atomic force microscopy.

In some embodiments, a device may comprise a sixth electrode, a seventh electrode or more electrodes. If present, these electrodes may also have any of the values of surface roughness as described above in relation to the fourth and/or fifth electrodes.

The fourth and/or fifth electrodes (e.g., electrode 850, electrodes 855), if present, may comprise any suitable material. In some embodiments, the fourth and/or fifth electrodes (e.g., electrode 850, electrodes 855) may comprise a two-dimensional material or a stack of two dimensional materials. In some embodiments, the fourth and/or fifth electrodes (e.g., electrode 850, electrodes 855) may comprise graphene.

In some embodiments, the fourth and/or fifth electrodes (e.g., electrode 850, electrodes 855) may comprise a nanomaterial, such as a nanocube or a nanoplate.

In some embodiments, the fourth and/or fifth electrodes (e.g., electrode 850, electrodes 855) may comprise a metal, a semiconductor, or a semimetal. In certain embodiments, the fourth and/or fifth electrodes (e.g., electrode 850, electrodes 855) may comprise a transition metal. In some embodiments, the fourth and/or fifth electrodes (e.g., electrode 850, electrodes 855) may comprise gold. In some embodiments, the fourth and/or fifth electrodes (e.g., electrode 850, electrodes 855) may comprise a gold nanoplate.

In some embodiments, a device may comprise a sixth electrode, a seventh electrode or more electrodes. If present, these electrodes may also comprise any of the same materials as described above for the fourth and/or fifth electrodes.

Devices disclosed herein may be fabricated in any suitable manner. In some embodiments, one or more device components may be directly deposited. Deposition methods may include evaporation onto a substrate, dip coating, spin coating, and any other suitable method.

In certain embodiments, one or more device components may be fabricated by using a self-assembly process and/or a directed assembly process. For instance, one or more electrodes may be made to assemble at the interface between two immiscible fluids. As another example, two or more electrodes (e.g., a first electrode 810 and a second electrode 820 or a second electrode 820 and a third electrode 825) may be functionalized with molecules that are capable of bonding with each other. The functionalized electrodes may be exposed to each other such that a bond forms between them. Non-limiting examples of bonds that may be formed include bonds formed due to click chemistry such as adamantane-cyclodextrin chemistry, bonds formed due to gold-thiol interactions, and bonds formed due to electrostatic attraction and other non-covalent interactions.

In certain embodiments, a template may be employed to assist in device fabrication. External stimuli such as electric field, magnetic field or light may also be used in assembly of the device components.

Example 1

This example describes an ultrafast electrically-driven and dynamically tunable optical nanoantenna based on the use of quantum tunneling junctions with a nanoscale design, allowing on-chip integration.

Figure 11:
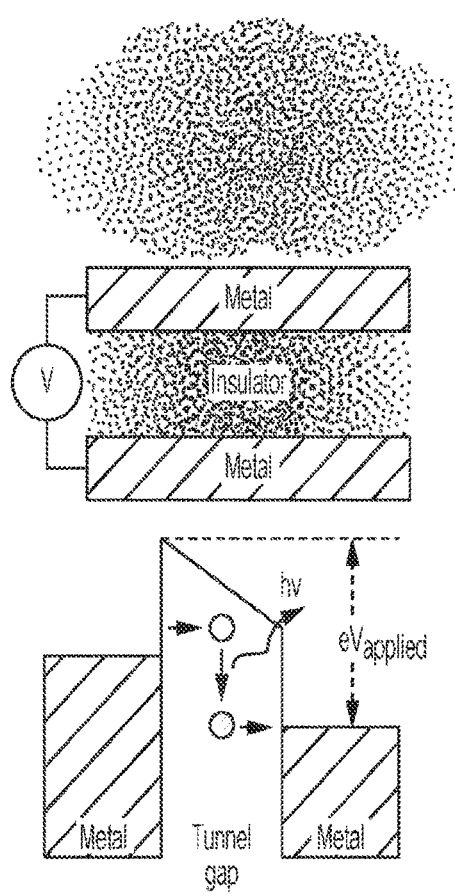
FIG. 11 shows, according to some embodiments, a schematic illustration of a device capable of emitting light when a tunneling current is present.

In this design, inelastic tunneling of electrons through a metal-insulator-metal (MIM) tunneling junction can excite a plasmon mode which can subsequently decay into far-field radiation to generate light. This is shown schematically in FIG. 11. The device response time may be limited only by the speed of tunneling, and so may enable femtosecond operation time. The tunneling junction may also allow device miniaturization to a fnanometer-scale regime, reducing the device footprint and making on-chip integration more practical.

Figure 12:
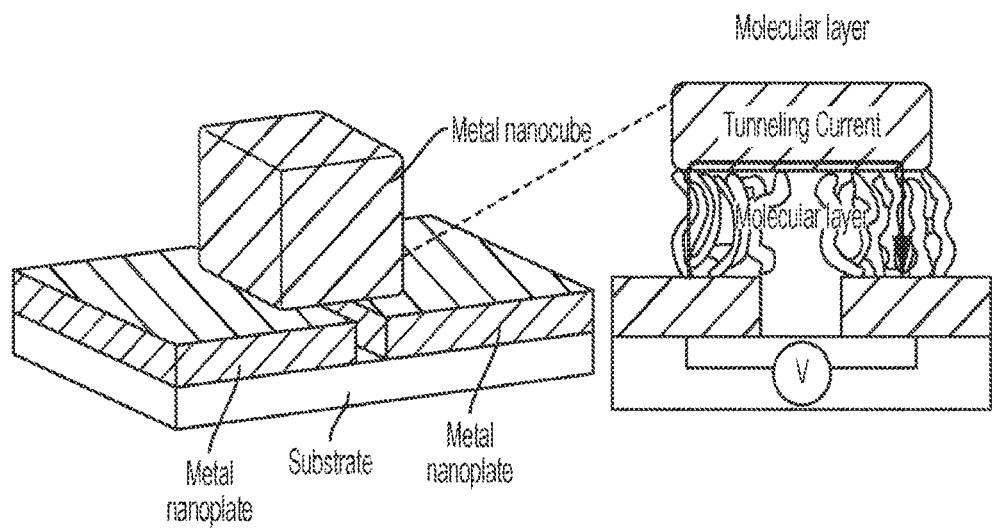
FIG. 12 shows, according to some embodiments, a schematic illustration of a metal nanocube positioned over two metal nanoplates.

The design described herein employs a versatile architecture with nanoscale precision in order to develop a light emitting tunnel junction in the form of a patch antenna. The device design is shown schematically in FIG. 12. The nanoscale patch antenna is composed of a metal nanocube (Au or Ag and less than 100 nm side length) separated from an underlying metal nanoplate with a well-defined gap of 2-10 nm. In order to apply an electric field across this junction in order to promote a tunneling current without the need for directly contacting the small nanocube, the bottom electrode may consist of two nanoplates separated by a nanogap of ~20-60 nm which is bridged by the floating nanocube. The metal nanocube and nanoplates may be chemically synthesized with single-crystalline surfaces and sub-nanometer surface roughness, promoting the formation of well-defined tunneling gaps which enhance the uniformity and directionality of the emitted light. The tunneling junction width is defined through the use of molecular layers, the length of which can be tuned precisely through chemical synthesis and thin film assembly techniques. In this design, the resonance wavelength is defined by the side length of the nanocube, and the thickness and refractive index of the gap material may be precisely tuned to enable spectral tenability in the range 500 nm to 900 nm. The sub-wavelength nanoscale design of the patch antenna may also enhance the efficiency of light outcoupling, reaching 89%. In addition, the electronic performance of the tunneling gap can be readily tuned through the selection of the gap material such that the device light emission efficiency can be optimized.

Figure 13:
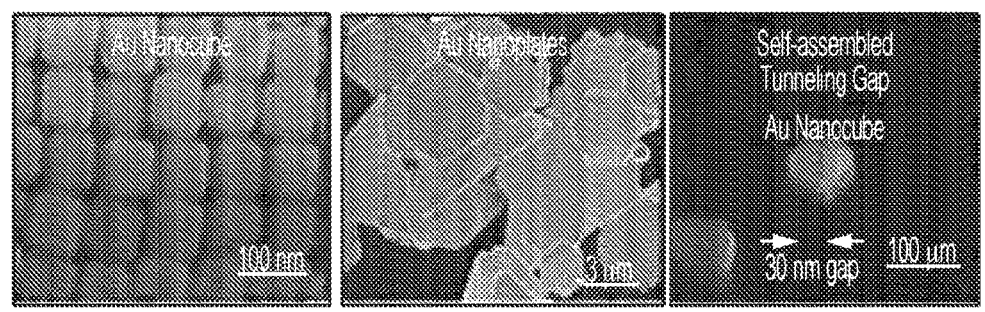
FIG. 13 shows, according to some embodiments, micrographs of gold nanoplates and gold nanocubes.

Devices described herein may be fabricated by using a lithography-free approach in which directed self-assembly through a bottom-up process is employed. This process may allow for the fabrication of devices with nanoscale precision, and can be combined with other processes that are less precise (such as, e.g., conventional lithography). FIG. 13 shows micrographs of exemplary electrodes and devices made by this process.

Figure 14:
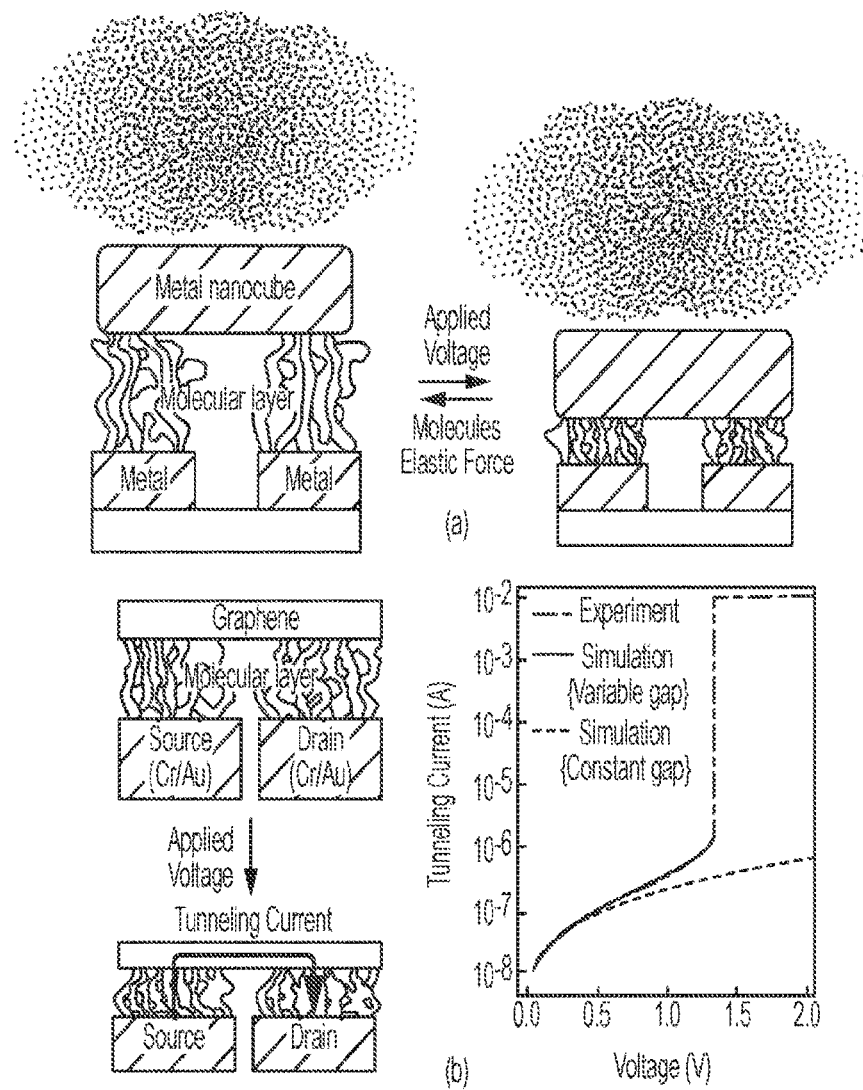
FIG. 14 shows, according to some embodiments, a schematic illustration of a device capable of undergoing deformation in response to an applied voltage.

The design can be further extended in order to enable dynamic tuning of the light emission spectrum and intensity. In this scheme, application of an electric field across the tunneling junction may provide sufficient electrostatic force to cause mechanical compression of the molecular layer and decrease the tunneling gap. An example of this design is shown in FIG. 14. The change in the metal-insulator-metal configuration upon reduction of the metal-metal distance leads to a change in the resonance of the structure and the consequent light emission spectrum. Through selection of the molecular layer, the amount of compression and thus the wavelength of the emitted light can be controlled. This approach may enable the a single device to be configured for operation at numerous wavelengths, and may enable complex data processing and multiplexing operations.

The tunneling-based electrically-driven and dynamically tunable light sources described herein can be useful for applications beyond optical nanoantennas in optical communication, such as interconnects and data processing. The tunable nanoscale sources can also be part of a platform for optical switching. The extension of this design to multi-terminal structures may also be feasible, and the design may be used to provide electrostatic and/or electromechanical gating. Additionally, the nanoscale light-sources may also be used for high resolution displays and in biological applications, such as sensing or manipulation of neural networks.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Any terms as used herein related to shape, orientation, alignment, and/or geometric relationship of or between, for example, one or more articles, structures, forces, fields, flows, directions/trajectories, and/or subcomponents thereof and/or combinations thereof and/or any other tangible or intangible elements not listed above amenable to characterization by such terms, unless otherwise defined or indicated, shall be understood to not require absolute conformance to a mathematical definition of such term, but, rather, shall be understood to indicate conformance to the mathematical definition of such term to the extent possible for the subject matter so characterized as would be understood by one skilled in the art most closely related to such subject matter. Examples of such terms related to shape, orientation, and/or geometric relationship include, but are not limited to terms descriptive of: shape—such as, round, square, circular/circle, rectangular/rectangle, triangular/triangle, cylindrical/cylinder, elliptical/ellipse, (n)polygonal/(n)polygon, etc.; angular orientation—such as perpendicular, orthogonal, parallel, vertical, horizontal, collinear, etc.; contour and/or trajectory—such as, plane/planar, coplanar, hemispherical, semi-hemispherical, line/linear, hyperbolic, parabolic, flat, curved, straight, arcuate, sinusoidal, tangent/tangential, etc.; direction—such as, north, south, east, west, etc.; surface and/or bulk material properties and/or spatial/temporal resolution and/or distribution—such as, smooth, reflective, transparent, clear, opaque, rigid, impermeable, uniform(ly), inert, non-wettable, insoluble, steady, invariant, constant, homogeneous, etc.; as well as many others that would be apparent to those skilled in the relevant arts. As one example, a fabricated article that would described herein as being "square" would not require such article to have faces or sides that are perfectly planar or linear and that intersect at angles of exactly 90 degrees (indeed, such an article can only exist as a mathematical abstraction), but rather, the shape of such article should be interpreted as approximating a "square," as defined mathematically, to an extent typically achievable and achieved for the recited fabrication technique as would be understood by those skilled in the art or as specifically described. As another example, two or more fabricated articles that would described herein as being "aligned" would not require such articles to have faces or sides that are perfectly aligned (indeed, such an article can only exist as a mathematical abstraction), but rather, the arrangement of such articles should be interpreted as approximating "aligned," as defined mathematically, to an extent typically achievable and achieved for the recited fabrication technique as would be understood by those skilled in the art or as specifically described.

What is claimed is:

1. A device, comprising:
   a first electrode;
   a second electrode; and
   an insulator layer positioned between the first electrode and the second electrode, wherein the insulator layer is configured such that tunneling occurs between the first electrode and the second electrode when a voltage difference is established between the first electrode and the second electrode, wherein the insulator layer is configured such that light emission occurs when tunneling occurs, and wherein the insulator layer is a deformable layer.

2. A device as in claim 1, wherein the device does not emit light in the absence of a tunneling current.

3. A device as in claim 1, wherein light emission can be reversibly switched on and off at a rate of greater than or equal to 100 GHz.

4. A device as in claim 1, wherein the light is visible light.

5. A device, comprising:
   a first electrode;
   a second electrode; and
   an insulator layer positioned between the first electrode and the second electrode, wherein the insulator layer is configured such that tunneling occurs between the first electrode and the second electrode when a voltage difference is established between the first electrode and the second electrode, wherein the insulator layer is configured such that light emission occurs when tunneling occurs, and wherein the light is infrared light.

6. A device as in claim 5, wherein the insulator layer is a deformable layer.

7. A device as in claim 5, wherein the insulator layer is not a deformable layer.

8. A method of operating a device, comprising:
   applying a voltage such that a tunneling current is generated between a first electrode and a second electrode, wherein the generation of the tunneling current causes light to be emitted, and wherein the device comprises an insulator layer positioned between the first electrode and the second electrode that is a deformable layer.

9. A method as in claim 8, wherein the device does not emit light in the absence of a tunneling current.

10. A method of operating a device, comprising:
    applying a voltage such that a tunneling current is generated between a first electrode and a second electrode, wherein the generation of the tunneling current causes light to be emitted, and wherein light emission can be reversibly switched on and off at a rate of greater than or equal to 100 GHz.

11. A method as in claim 8, wherein the light is visible light.

12. A method of operating a device, comprising:
    applying a voltage such that a tunneling current is generated between a first electrode and a second electrode, wherein the generation of the tunneling current causes light to be emitted, and wherein the light is infrared light.

13. A method as in claim 10, wherein the device comprises an insulator layer positioned between the first electrode and the second electrode, and wherein the insulator layer is a deformable layer.

14. A method as in claim 10, wherein the device comprises an insulator layer positioned between the first electrode and the second electrode, and wherein the insulator layer is not a deformable layer.

15. A device as in claim 1, wherein the first electrode is a mechanically floating electrode.

16. A device as in claim 1, wherein the first electrode has a surface roughness of less than or equal to 1 nm.

17. A device as in claim 1, wherein the first electrode comprises graphene.

18. A device as in claim 1, wherein the first electrode comprises a nanocube having a side length of less than or equal to 200 nm.

19. A device as in claim 1, wherein the first electrode is single crystalline.

20. A device as in claim 1, wherein the second electrode comprises a nanoplate.

* * * * *

UNITED STATES PATENT AND TRADEMARK OFFICE
CERTIFICATE OF CORRECTION

PATENT NO. : 10,566,492 B2
APPLICATION NO. : 15/781652
DATED : February 18, 2020
INVENTOR(S) : Farnaz Niroui et al.

It is certified that error appears in the above-identified patent and that said Letters Patent is hereby corrected as shown below:

On the Title Page

(73) Assignee: Massachuesetts Institute of Technology, Cambridge, MA (US)
Should read:
(73) Assignee: Massachusetts Institute of Technology, Cambridge MA (US)

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*